(12) United States Patent
Yeh et al.

(10) Patent No.: US 6,545,245 B2
(45) Date of Patent: Apr. 8, 2003

(54) METHOD FOR DRY CLEANING METAL ETCHING CHAMBER

(75) Inventors: Chia-Fu Yeh, Taipei (TW); Jui-Chun Kuo, Hsin-Chuang (TW); Wen-Shan Wei, Taipei (TW); Wen-Sheng Chien, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 65 days.

(21) Appl. No.: 09/847,108

(22) Filed: May 2, 2001

(65) Prior Publication Data

US 2002/0162827 A1 Nov. 7, 2002

(51) Int. Cl.$^7$ ............................................. B23K 10/00
(52) U.S. Cl. ............................ 219/121.41; 219/121.43; 156/345; 134/1.1
(58) Field of Search .................... 219/121.4, 121.41, 219/121.43, 121.59, 67, 69; 204/298.31; 134/2, 1.1, 8, 21, 26, 1.2, 1.3; 156/345

(56) References Cited

U.S. PATENT DOCUMENTS

| | | | |
|---|---|---|---|
| 5,454,903 A | * 10/1995 | Redeker et al. | 216/67 |
| 5,474,615 A | * 12/1995 | Ishida et al. | 134/1.2 |
| 5,911,834 A | * 6/1999 | Fairbairn et al. | 134/1.3 |
| 6,125,859 A | * 10/2000 | Kao et al. | 134/1.1 |
| 6,290,779 B1 | * 9/2001 | Saleh et al. | 134/2 |

* cited by examiner

Primary Examiner—Mark Paschall
(74) Attorney, Agent, or Firm—Powell, Goldstein, Frazer & Murphy LLP

(57) ABSTRACT

In accordance with the present invention, a method is provided for dry cleaning a processing chamber. This method comprises the step of introducing a first cleaning process gas into the processing chamber. A plasma is formed from the first cleaning process gas and maintained for a first time period. Next, repeating the step of introducing the cleaning process gas, a second cleaning process gas is introduced into the processing chamber and maintained the plasma for a second time period. As a result, the present invention is capable of removing polymer built up on the processing chamber's interior surfaces to achieve a high yield and maintaining throughput of the substrates in the plasma processing system.

21 Claims, 5 Drawing Sheets

METHOD FOR DRY CLEANING METAL ETCHING CHAMBER

BACKGROUND OF THE INVENTION

1. Field of the Invention

The present invention generally relates to a method for dry cleaning processing chambers, and more particularly to a method for dry cleaning metal etching chambers.

2. Description of the Prior Art

Semiconductor processing involves a number of different chemical and physical processes whereby minute integrated circuits are created on the substrate. As the geometric size of semiconductor devices become ever so smaller, the ability to maintain the uniformity and accuracy of critical dimensions becomes strained. Many of the processes carried out within semiconductor processing reactors leave contaminant deposits on the wall of the process chamber which accumulate and become the source of particulate matter that's harmful to the creation of a semiconductor device. Contaminant deposit buildup on semiconductor processing chamber walls can be particularly significant when metal etching processes are carried out in the chamber. An important way to improve quality and overall efficiency in fabricating devices is to clean the chamber effectively and economically.

In general, the manufacturing of integrated circuit devices includes the use of a plasma etching chamber, which are capable of etching selected layers defined by a photoresist mask. The processing chambers are configured to receive processing gases while a radio frequency (RF) power is applied to one or more electrodes of the processing chamber. The pressure inside the processing chamber is also controlled for the particular process. Upon applying the desired RF power to the electrodes, the process gases in the chamber are activated such that a plasma is created. The plasma is thus configured to perform the desired etching of the selected layers of the semiconductor wafer.

During an etching process of a semiconductor wafer in a plasma reactor, polymer can be built up on the chamber walls, gas distribution plate (GDP) and interior parts. Over time, failure to clean the residue from the chamber walls often results in degraded, unreliable processes and defective substrates. Without frequent cleaning procedures, impurities from the residue built up in the chamber walls can migrate onto the substrate. Particularly, when the polymer peeling occurs, the yield kill rate can be higher than 10%. Providing an efficient, non-damaging clean chamber is often able to enhance performance and quality of the devices produced. Two methods of cleaning a processing chamber are in-situ cleaning (also known as dry cleaning) and wet cleaning.

In an in-situ cleaning operation, process gases are evacuated from the processing chamber and one or more cleaning process gases are introduced. Energy is then applied to promote a reaction between the gases and any residues that may have accumulated on the process chamber's interior surfaces. Residues on the process chamber's interior surfaces react with the cleaning process gases, forming gaseous by-products which are exhausted from the processing chamber, along with unreacted portions of the cleaning process gases. The cleaning process is followed by the resumption of normal processing. In contrast to an in-situ cleaning procedure, in which the processing chamber remains sealed, a wet cleaning procedure is performed by breaking the processing chamber's vacuum seal and manually wiping down the chamber's interior surfaces. Such a wet cleaning operation affects a processing system's throughput in a worse way than a dry cleaning operation does. When a wet clean is performed, opening the processing chamber and physically wiping the chamber's interior surfaces results in more down-time (about 14 to 16 hours), compared to the dry clean which only takes minutes, because the process must subsequently be re-stabilized.

When polymer is built up on the processing chamber's interior surfaces, the particle out of control rate is extremely higher resulting in decreased yield. Moreover, when a sudden power interruption occurs, the vacuum pump fails, or the software crashes, the polymer built up on the processing chamber's interior surfaces will start peeling off, thus a very time-consuming wet clean operation is needed. A wet clean procedure is normally performed to remove residues that are not entirely removed by the in-situ cleaning process, and thus slowly accumulate over time. After longer periods of time, typically about 9000 RF-minutes (150 RF-hour), a wet clean is required. The delay due to the down time required for cleaning also represents a substantial loss in production yield. Clearly, it is desirable to minimize the amount of cleaning time required in order to improve the throughput of wafers through the processing chamber. That is to say, to extend the mean time between clean (MTBC) is critical to achieve the goal. The method used here pertains to a wet clean. Therefore, improved methods for cleaning semiconductor processing chambers is needed. In particular, the cleaning methods should be capable of removing polymer built up on the processing chamber's interior surfaces to achieve a high yield and maintaining throughput of the substrates in the plasma reactor.

SUMMARY OF THE INVENTION

The present invention is directed towards a method for cleaning the processing chamber of a substrate processing system used in processing operations such as the deposition and/or etching of substrates. In accordance with the present invention, a method is provided for dry cleaning a metal etching chamber. This method comprises the step of introducing a first cleaning process gas into the processing chamber at a first flow rate. A plasma is formed from the first cleaning process gas and maintained for a first time period. Next, repeating the step of introducing the cleaning process gas, a second cleaning process gas is introduced into the processing chamber at a second flow rate and maintained the plasma for a second time period. As a result, the present invention is capable of removing polymer built up on the processing chamber's interior surfaces to achieve a high yield and maintaining throughput of the substrates in the plasma processing system.

It is another object of this invention that a cleaning process gas is provided for dry cleaning a processing chamber.

It is a further object of this invention that a two-step cleaning method is provided for dry cleaning a processing chamber.

It is another further object of this invention that a method for extending the mean time between cleaning is provided.

It is another further object of this invention that a method for reducing the particle out of control rate is provided.

In one embodiment, a method is provided for dry cleaning a processing chamber. This method comprises the step of introducing a first cleaning process gas into the processing chamber at a first flow rate. A plasma is formed from the first cleaning process gas and maintained for a first time period. Next, repeating the step of introducing the cleaning process gas, a second cleaning process gas is introduced into the processing chamber at a second flow rate and maintained the plasma for a second time period. The method further comprises the step of generating a plasma by applying RF energy to the first and second cleaning process gases, wherein the RF energy is about 800 W applied to the first electrode. The method further comprises the step of applying a power of about 4 W to the second electrode, wherein the second electrode is also a substrate holder. Thus, the polymer built up on the holder can also be removed. The method further comprises the step of evacuating the first cleaning process gas from the processing chamber between the first and the second time periods while maintaining the plasma. As a result, the present invention is capable of removing polymer built up on the processing chamber's interior surfaces to achieve a high yield and maintaining throughput of the substrates in the plasma processing system.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Some sample embodiments of the invention will now be described in greater detail. Nevertheless, it should be noted that the present invention can be practiced in a wide range of other embodiments besides those explicitly described, and the scope of the present invention is expressly not limited except as specified in the accompanying claims.

The present invention discloses a method for dry cleaning a plasma etch chamber by first introducing a first cleaning process gas into the processing chamber. Then, a plasma is formed from the first cleaning process gas and maintained for a first time period. Next, repeating the step of introducing the cleaning process gas, a second cleaning process gas is introduced into the processing chamber and maintained the plasma for a second time period to remove contaminating byproducts from the chamber.

Figure 1:
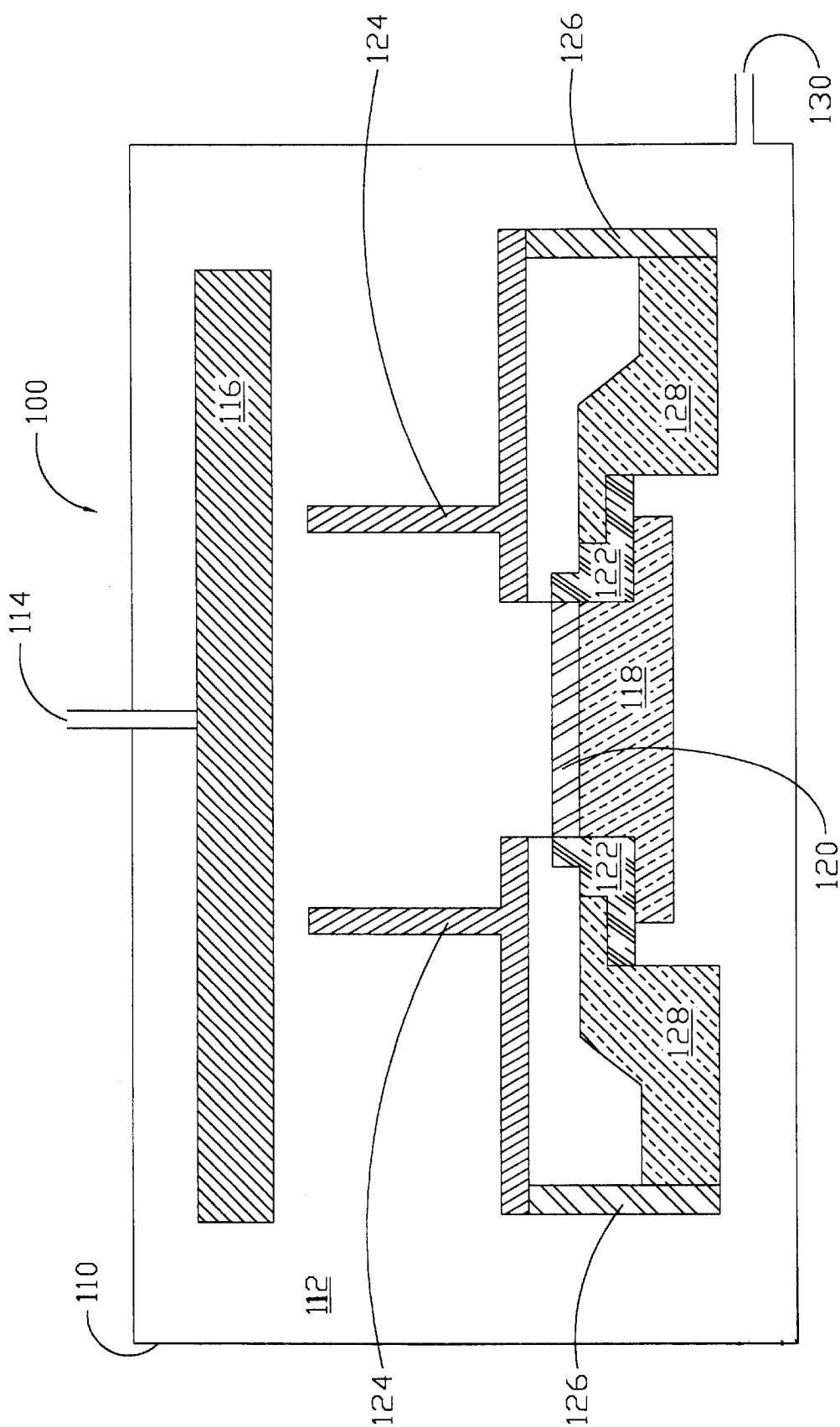
FIG. 1 is a simplified cross-sectional view of a processing chamber.

Referring initially to FIG. 1, wherein a simplified cross-sectional view of a processing chamber 100 is shown. The processing chamber 100 is a metal etcher that includes a housing 110 that is typically made of non-magnetic material which defines a chamber 112. The process gases flow through a gas inlet 114 to a gas distribution plate 116 which acts as a first electrode is connected to an RF power generator (not shown) which is in turn connected to a substrate holder 118. The main purpose of the gas distribution plate 116 is to distribute the gas evenly over the wafer in such a way as to produce a uniform wafer etch or deposition. The substrate holder 118 acts as a second electrode. A semi-conducting substrate 120 to be processed is positioned on the substrate holder 118. The substrate 120 is normally held against the holder 118 by an edge ring 122. A U-ring 124 is then positioned on the edge ring 122. A lifter 126 and a ground ring 128 are also equipped to support the substrate holder 118. An exhaust port 130 is connected to a vacuum pump (not shown) to evacuates the chamber.

In one preferred embodiment, the method for dry cleaning the processing chamber 100 is disclosed. The processing chamber 100 is a plasma chamber, particularly a metal etching chamber. During the metal etching process, a metal based contaminant/polymer is first built up on the interior surfaces of the processing chamber. As the etching process is going on, a photoresist based contaminant/polymer is then built up on the interior surfaces of the processing chamber that is coated with metal based polymer. The method comprises the step of introducing a first cleaning process gas into the metal etching chamber, wherein the first cleaning process gas comprises oxygen with a first flow rate of about between 210 and 250 standard cubic centimeter per minute (SCCM). The preferred flow rate of oxygen is about 230 SCCM. The pressure inside the processing chamber 100 is about between 20 and 40 mtorr, and the preferred pressure is about 30 mtorr. Then, a plasma is formed from the oxygen gas and maintained for a first time period. The first time period of maintaining the oxygen plasma is about between 10 and 14 seconds, and the preferred first time period is about 12 seconds.

By use of oxygen gas as the cleaning process gas can effectively remove the photoresist based polymer coated on the interior surfaces of the processing chamber 100, but as for removing the metal based polymer is less effectively. Then, for removing the metal based polymer by repeating the step of introducing the cleaning process gas, a second cleaning process gas is introduced into the processing chamber 100. The second cleaning process gas comprises chlorine with a second flow rate of about between 140 and 180 SCCM, and the plasma is maintained for a second time period. The preferred flow rate of chlorine is about 160 SCCM. The second time period of maintaining the plasma is about between 8 and 12 seconds, and the preferred second time period is about 10 seconds. The pressure inside the processing chamber 100 is also kept at about between 20 and 40 mtorr, and the preferred pressure is kept at about 30 mtorr.

In another embodiment, the method comprises the step of introducing a cleaning processing gas into the metal etching chamber 100, particularly an aluminum etching chamber. The cleaning process gas comprises the mixture of oxygen and chlorine at a flow rate of about between 180 and 220 SCCM and about between 130 and 170 SCCM, respectively. The preferred flow rate of oxygen and chlorine is about 200 SCCM and 150 SCCM, respectively. A plasma is formed from the gas mixture and maintained for a time period of about between 22 seconds and 28 seconds, the preferred time preferred time period is about 25 seconds. The pressure inside the chamber is about between 20 and 40 mtorr, and the preferred pressure is about 30 mtorr.

The method further comprises the step of generating a plasma by applying RF energy to the first and second cleaning process gases, such as oxygen and chlorine gases, wherein the RF energy is about between 600 and 1000 W applied to the first electrode. The preferred RF power applied to the first electrode is about 800 W. The method further comprises applying a power of about between 2 W and 6 W to the second electrode, and the preferred power applied to the second electrode is about 4 W, so that the polymer built up on the substrate holder 118 can also be effectively removed. If there is a sacrificial substrate (also known as a dummy wafer) positioned on the substrate holder 118 to protect the holder 118 from damage during the plasma cleaning operation, the power applied to the second electrode can be set between about 100 W and about 250 W. Thus, the method is feasible at the wafer/waferless condition. The method further comprises the step of evacuating the first cleaning process gas from the chamber 100 between the first and the second time periods while maintaining the plasma.

Figure 2:
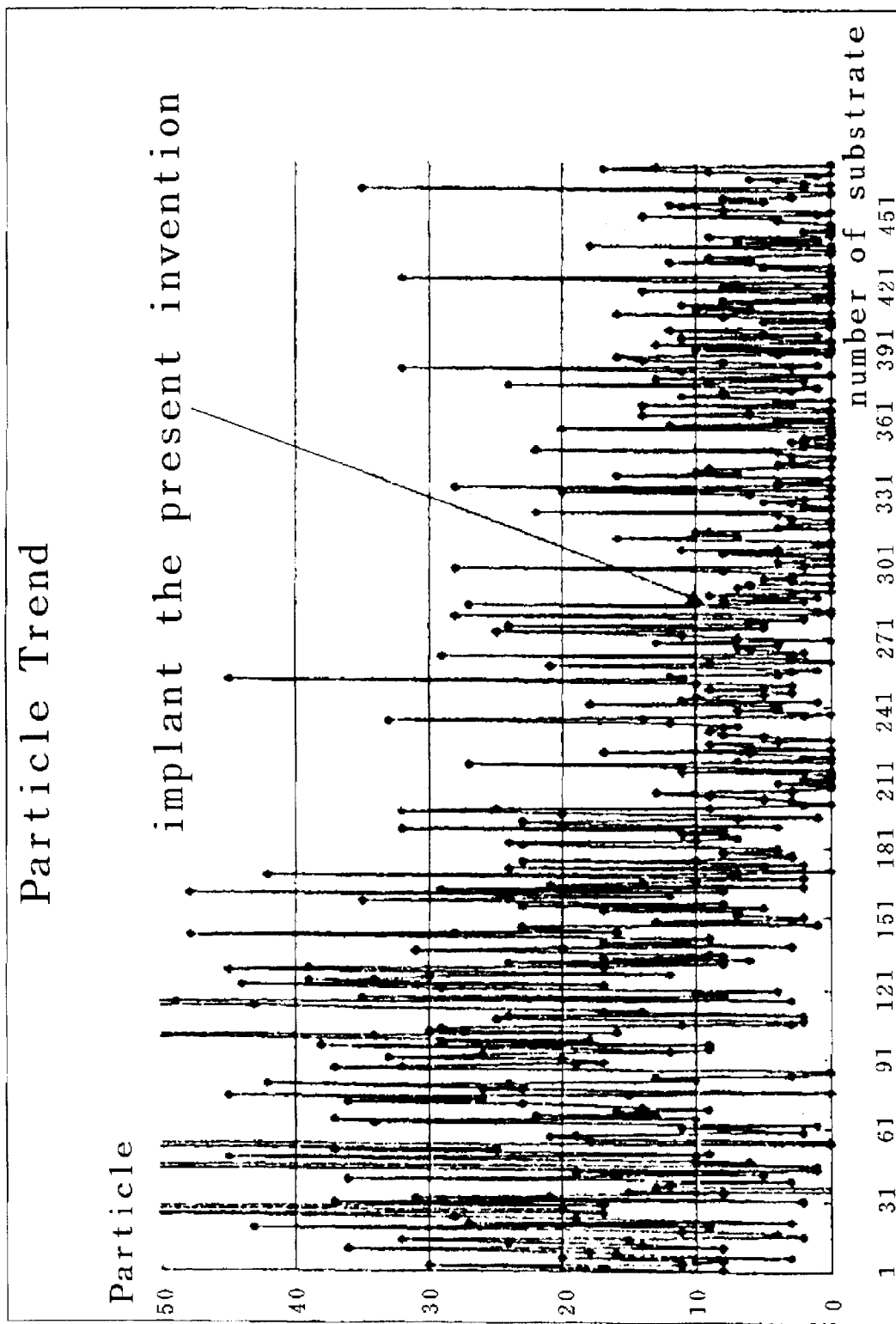
FIG. 2 is an illustration showing the effect of the present invention in-situ chamber cleaning process in a contaminating particle count diagram.
Figure 3:
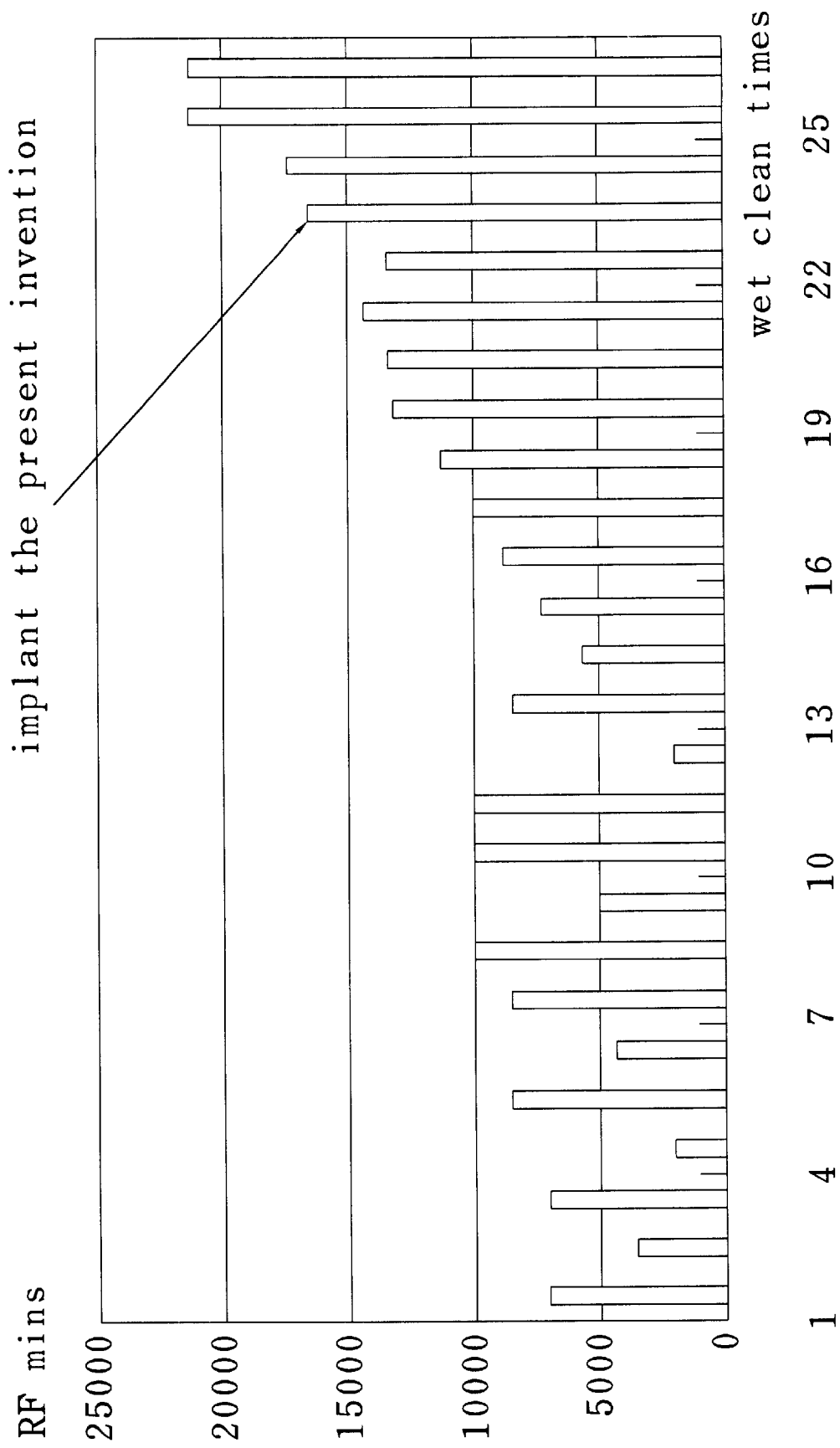
FIG. 3 is an illustration showing the effect of the present invention in-situ chamber cleaning process in a mean time between clean diagram.

Referring to FIG. 2, an illustration shows the effect of the present invention in-situ chamber cleaning process in a contaminating particle count diagram. The contaminating particle count is plotted on a scale of substrates processed. It is seen that after the implementation of the present invention, the average count of contaminating particles is about 5, and the out of control rate is also reduced to 1.01%. The benefits made possible by the present invention is also shown in FIG. 3. By use of the present invention, it has been found that the wet cleaning procedure is conducted after over 20000 RF-minutes. This is an improvement from the conventional technique in which a wet cleaning process must be carried out after about 9000 RF-minutes. A significant saving in machine down time and manpower results in a subsequent increase in throughput of the processing system and a reduction in cost.

Figure 4A:
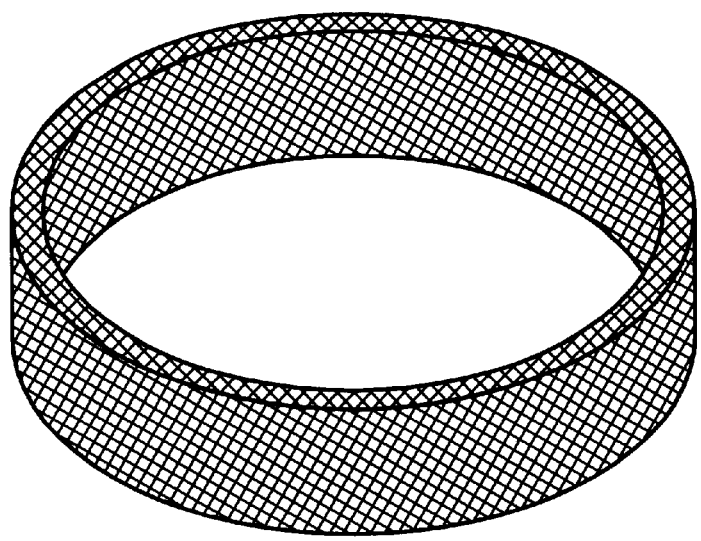
FIGS. 4A and 4B are schematic representations of polymer build-up on U-rings with/without using the present invention.
Figure 4B:
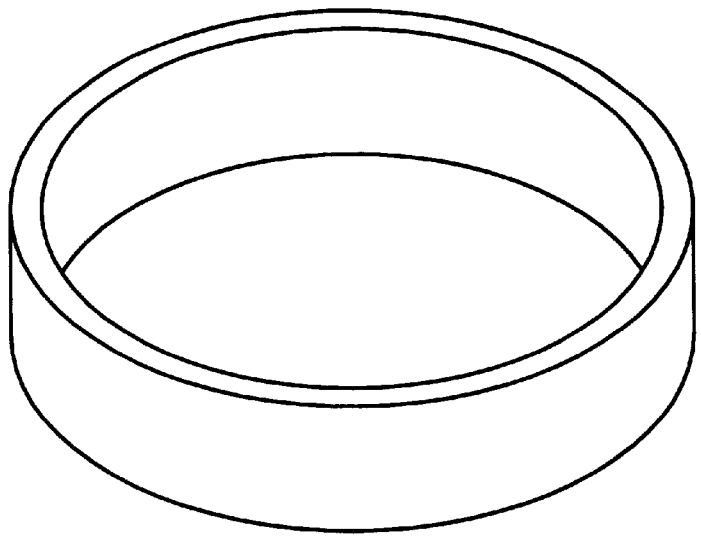
Figure 5A:
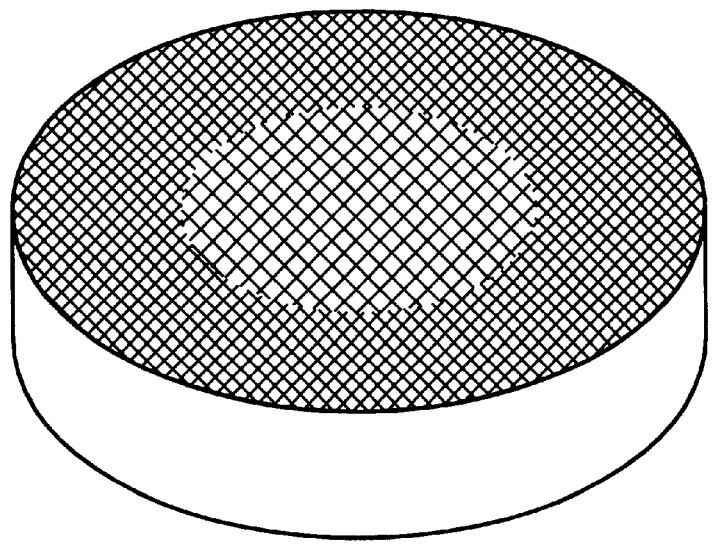
FIGS. 5A and 5B are schematic representations of polymer build-up on gas distribution plates with/without using the present invention.
Figure 5B:
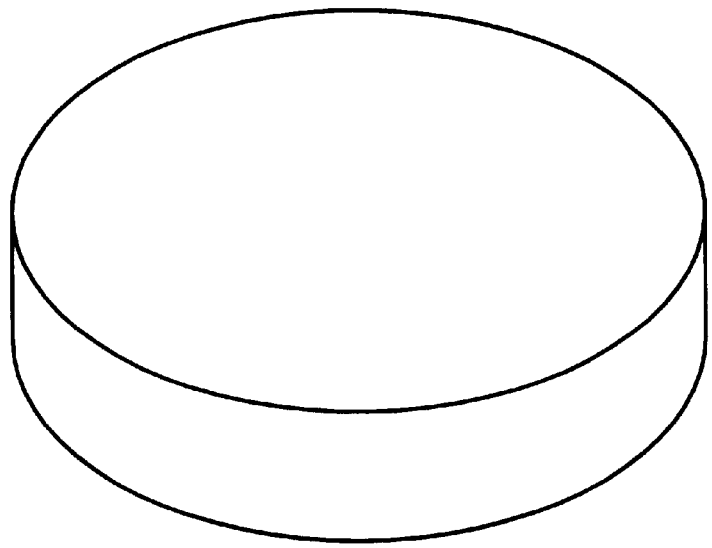

Referring to FIGS. 4A and 4B, it is seen that the polymer build-up on the U-ring is very serious in the prior art, and the U-ring used while implanting the present invention has less contaminant build-up. It is also found in the schematic representations of polymer build-up on gas distribution plates with/without implanting the present invention that the polymer build-up on GDP is seriously greater in the prior art. The GDP while implanting the present invention has less contaminant build-up, shown in FIGS. 5A and 5B, respectively. It is noted here that the present invention can proceed after a substrate is processed and can also be executed after a plurality of substrates is processed. The timing of execution with the present invention depends on the conditions of the processing chamber. That is to say, the present invention is capable of removing polymer built up on the processing chamber's interior surfaces to achieve a high yield and maintaining throughput of the substrates in the plasma processing system.

Although specific embodiments have been illustrated and described, it will be obvious to those skilled in the art that various modifications may be made without departing from what is intended to be limited solely by the appended claims.

What is claimed is:

1. A method for dry cleaning a process chamber, said method comprising:
   introducing a mixture of oxygen and chlorine cleaning process gas into said processing chamber;
   forming a plasma from said mixture of oxygen and chlorine cleaning process gas; and
   maintaining said plasma for a time period.

2. The method according to claim 1, wherein said processing chamber has a first electrode and a second electrode.

3. The method according to claim 2, further comprising generating said plasma by applying an RF energy to said mixture of oxygen and chlorine cleaning process gas, wherein said RF energy is about 800 W applied to said first electrode.

4. The method according to claim 2, further comprising applying a power of about 4 W to said second electrode.

5. The method according to claim 1, wherein said first flow rate is about 200 SCCM.

6. The method according to claim 1, wherein said second flow rate is about 150 SCCM.

7. The method according to claim 1, wherein said time period is about 25 seconds.

8. A method for dry cleaning a processing chamber, said method comprising:
   introducing an oxygen cleaning process gas into said processing chamber;
   forming an oxygen plasma from said oxygen cleaning process gas;
   maintaining said oxygen plasma for a first time period;
   introducing a chlorine cleaning process gas into said processing chamber; and
   maintaining said oxygen plasma for a second time period.

9. The method according to claim 8, wherein said processing chamber has a first electrode and a second electrode.

10. The method according to claim 8, wherein a flow rate of said oxygen cleaning process gas is about 230 SCCM (standard cubic centimeters per minute).

11. The method according to claim 9, further comprising generating said oxygen plasma by applying an RF energy to said oxygen cleaning process gas and said chlorine cleaning process gas, wherein said RF energy is about 800 W applied to said first electrode.

12. The method according to claim 9, further comprising applying a power of about 4 W to said second electrode.

13. The method according to claim 8, wherein said first time period is about 12 seconds.

14. The method according to claim 8, wherein the flow rate of said chlorine cleaning process gas is about 160 SCCM (standard cubic centimeters per minute).

15. The method according to claim 8, wherein said second time period is about 10 seconds.

16. The method according to claim 8, further comprising the step of evacuating said oxygen cleaning process gas from said processing chamber between said first and said second time periods while maintaining said oxygen plasma.

17. The method according to claim 8, wherein said processing chamber is a metal etching chamber.

18. A method for dry cleaning a metal etching chamber, said method comprising:
   introducing an oxygen cleaning process gas with a flow rate of about 230 SCCM (standard cubic centimeter per minute) into said metal etching chamber, wherein said metal etching chamber has a first electrode and a second electrode;
   performing an RF energy to said oxygen cleaning process gas to generate an oxygen plasma;
   maintaining said oxygen plasma for a first time period of about 12 second to remove a photoresist based polymer on the interior surface of said metal etching chamber;
   introducing a chlorine cleaning process gas with said flow rate of about 160 SCCM (standard cubic centimeters per minute) into said metal etching chamber; and
   maintaining said oxygen plasma for a second time period of about 10 second to remove a metal based polymer on said interior surface of said metal etching chamber.

19. The method according to claim 18, wherein said RF energy is about 800 W applied to said first electrode.

20. The method according to claim 18, wherein said RF energy is about 4 W applied to said second electrode.

21. The method according to claim 18, further comprising a step of evacuating said oxygen cleaning process gas away from said metal etching chamber between said first and said second time periods while maintaining said oxygen plasma.

* * * * *